United States Patent [19]

Susak

[11] Patent Number: 5,166,983
[45] Date of Patent: Nov. 24, 1992

[54] MUTE CIRCUIT FOR AUDIO AMPLIFIERS
[75] Inventor: David M. Susak, Chandler, Ariz.
[73] Assignee: Motorola, Inc., Schaumburg, Ill.
[21] Appl. No.: 733,938
[22] Filed: Jul. 22, 1991
[51] Int. Cl.[5] .................... H03G 3/00; H04B 1/00; H03K 5/22
[52] U.S. Cl. .................... 381/104; 381/107; 455/224; 307/355
[58] Field of Search .............. 381/94, 107, 108, 110, 381/104; 455/218, 219, 220, 221, 222, 223, 224; 307/355, 362, 359, 254

[56]  References Cited
U.S. PATENT DOCUMENTS

| | | | |
|---|---|---|---|
| 3,986,051 | 10/1976 | Okada et al. | 307/254 |
| 4,099,127 | 7/1978 | Juniper | 455/224 |
| 4,176,286 | 11/1979 | Shuffield, Jr. | 455/218 |
| 4,288,753 | 9/1981 | Babano | 455/223 |
| 4,410,858 | 10/1983 | Kusakabe | 307/355 |
| 4,496,849 | 1/1985 | Kotowaski | 307/254 |
| 4,760,286 | 7/1988 | Pigott | 307/355 |
| 4,948,991 | 8/1990 | Schucker et al. | 307/254 |
| 4,977,609 | 12/1990 | McClure | 455/78 |
| 4,991,227 | 2/1991 | Kehler, Jr. | 455/220 |

Primary Examiner—James L. Dwyer
Assistant Examiner—Jack Chiang
Attorney, Agent, or Firm—Bradley J. Botsch, Sr.

[57] ABSTRACT

A mute circuit for an audio amplifier has been provided. The mute circuit alternately switches from a normal mode of operation to a mute mode of operation. In the normal mode of operation, the mute circuit utilizes a first op amp circuit to amplify an input signal by a predetermined factor. In the mute mode of operation, the mute circuit utilizes a second op amp circuit which is configured as an unity gain amplifier. In the mute mode, DC shifts occurring at the output of the second op amp circuit are minimized. Further, the second op amp circuit has a low output impedance thereby providing excellent attenuation of an audio input signal when the mute circuit is utilized in an audio amplifier application.

6 Claims, 2 Drawing Sheets

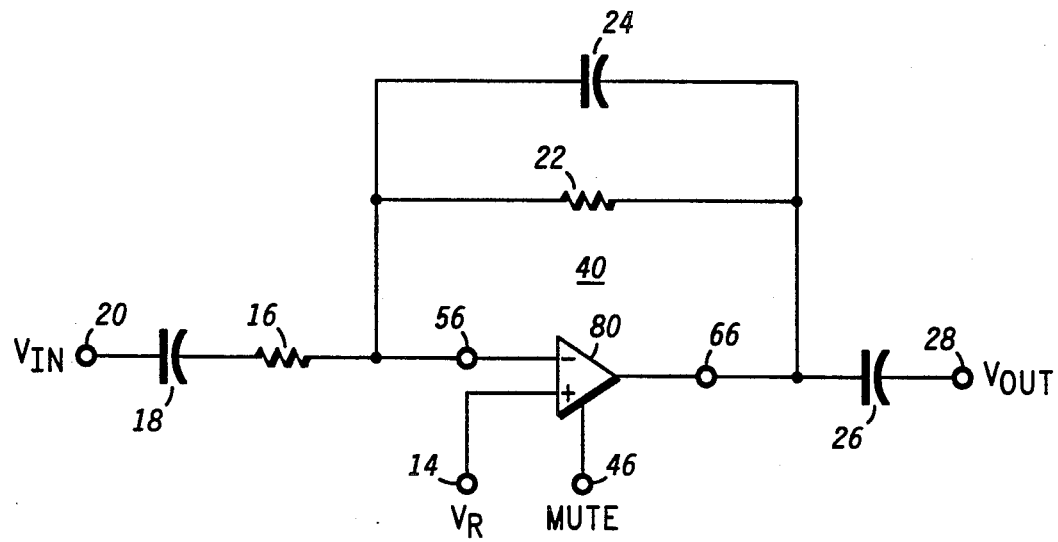
*FIG. 3*
*FIG. 4*
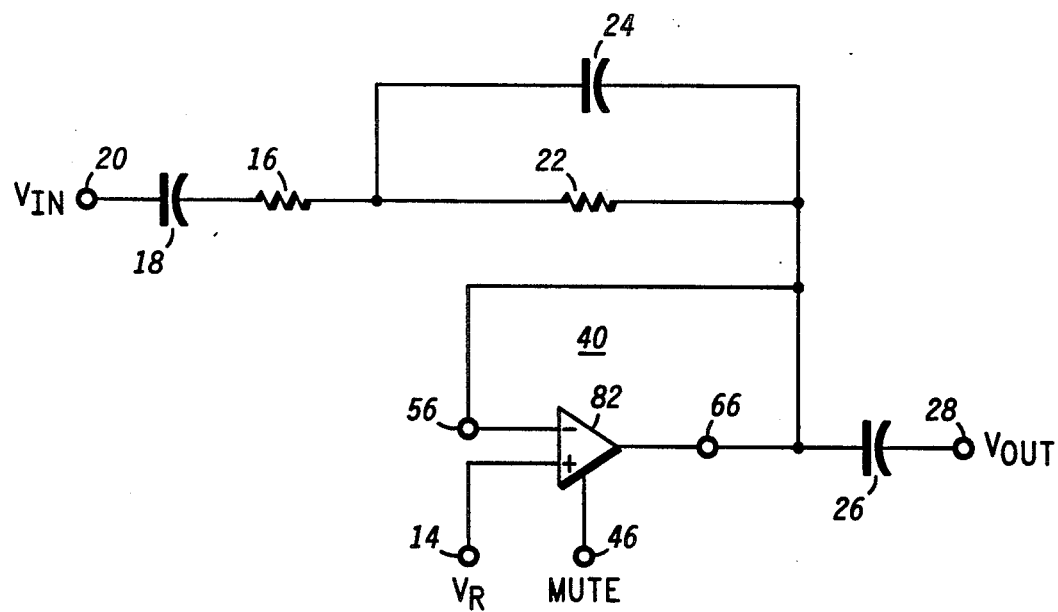

MUTE CIRCUIT FOR AUDIO AMPLIFIERS

BACKGROUND OF THE INVENTION

This invention relates to amplifiers and, in particular, to a mute circuit for an audio amplifier.

Audio amplifiers are utilized to amplify signals in the audio frequency range wherein the amplified signal is used to drive a load such as a speaker.

A basic audio amplifier typically includes an operational amplifier having inverting and non-inverting inputs and an output. The non-inverting input of the operational amplifier is coupled to receive a reference voltage. The inverting input of the operational amplifier is coupled through a resistor and typically a coupling capacitor to receive an input voltage. The output of the operational amplifier is typically coupled through a coupling capacitor to provide an output voltage. Further, the output of the operational amplifier is coupled back to the inverting input of the operational amplifier through a feedback resistor. Further, there may also be a filter capacitor coupled across the feedback resistor.

There exists many situations where it is desired to mute an audio amplifier. In a mute mode, the output signal of the amplifier is heavily attenuated with respect to the input signal.

One attempt that prior art has made for muting an audio amplifier is to couple the current carrying electrodes of a transistor across the inverting input and the output of the operational amplifier. Thus, when a logic high voltage level is applied to the control electrode of the transistor, the transistor is driven into saturation thereby effectively shorting the inverting input of the operational amplifier to the output of the operational amplifier. However, in order to receive acceptable attenuation, the saturation resistance of the transistor must be much less than the feedback transistor of the operational amplifier thereby requiring a large device. Further, when muting is switched on, a DC shift in voltage will occur at the output of the operational amplifier thereby causing a pop to a speaker that is typically coupled to the output of the operational amplifier.

Another attempt that prior art has made for muting an audio amplifier is to couple a pair of transistors between the output of the operational amplifier and the coupling capacitor. In this implementation, when a logic high voltage is applied to the bases of the transistors, the transistors are driven into saturation allowing the input signal to be passed through the audio amplifier to allow normal operation. On the other hand, when a logic low voltage level is applied to the bases of the transistors, the transistors effectively provide an open circuit thereby preventing the input signal from reaching the output. However, in this implementation, when the transistors are turned on, they must have a very low saturation resistance to avoid attenuation of the output signal, for example, less than 15 ohms. This is typically difficult to achieve on an integrated circuit without substantially increasing the cost of the integrated circuit.

Another disadvantage of the second attempt is that a non-linear device is coupled in series with the load thereby causing distortion.

Hence, a need exists for an improved mute circuit for an audio amplifier.

SUMMARY OF THE INVENTION

Briefly, there is provided a circuit comprising a first operational amplifier circuit having non-inverting and inverting inputs and an output, the non-inverting input being coupled to receive a reference voltage, the inverting input being coupled to receive an input signal, and the output being coupled to an output terminal; a second operational amplifier circuit having non-inverting and inverting inputs and an output, the non-inverting input of the second operational amplifier circuit being coupled to receive the reference voltage, the inverting input of the second operational amplifier circuit being coupled to the output of the second operational amplifier circuit, the output of the second operational amplifier circuit being coupled to the output terminal; and a switching circuit responsive to a control signal for alternately rendering the first and second operational amplifier circuits active.

The present invention will be better understood from the following detailed description taken in conjunction with the accompanying drawings.

BRIEF DESCRIPTION OF THE DRAWINGS

FIG. 3 is a simplified schematic diagram illustrating the mute circuit of FIG. 2 configured as an audio amplifier while operating in a first mode; and FIG. 4 is a simplified schematic diagram illustrating the mute circuit of FIG. 2 configured as an audio amplifier while operating in a second mode.

DETAILED DESCRIPTION OF THE DRAWINGS

Figure 1:
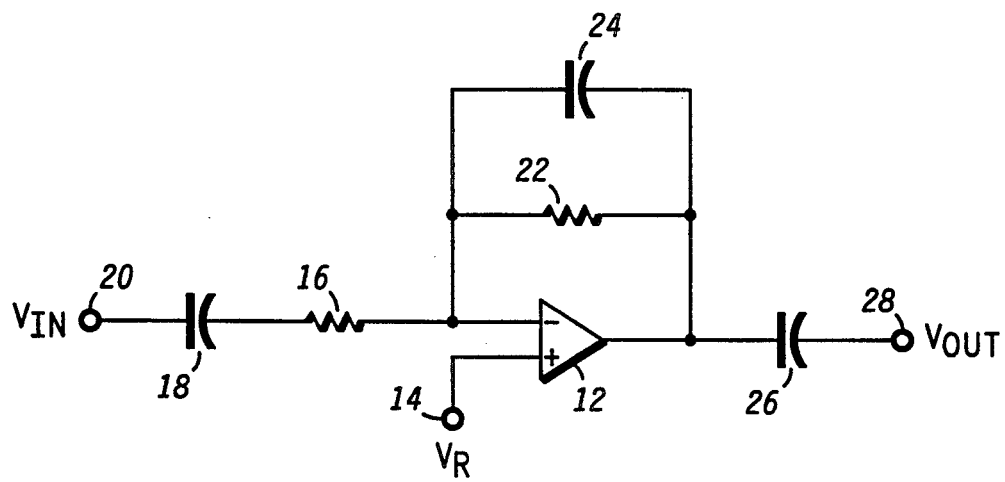
FIG. 1 is a detailed schematic diagram illustrating an operational amplifier configured as a basic prior art audio amplifier.

Referring to FIG. 1, a detailed schematic illustrating operational amplifier 12 configured as a basic prior art audio amplifier is shown. Operational amplifier (op amp) 12 has a non-inverting input coupled to terminal 14 at which reference voltage $V_R$ is applied. The inverting input of op amp 12 is coupled to a first terminal of resistor 16 while the second terminal of resistor 16 is coupled to a first terminal of coupling capacitor 18. The second terminal of coupling capacitor 18 is coupled to terminal 20 at which input voltage $V_{IN}$ is applied.

The inverting input of op amp 12 is coupled to the output of op amp 12 through feedback resistor 22. Further, filter capacitor 24 is coupled across resistor 22.

The output of op amp 12 is coupled through coupling capacitor 26 to terminal 28 at which output voltage $V_{OUT}$ is provided.

In operation, the audio amplifier of FIG. 1 configures op amp to function as an inverting gain stage wherein the gain (G) is substantially equal to the value of feedback resistor 22 divided by the value of resistor 16, as is understood.

Further, coupling capacitors 18 and 26 are respectively utilized for AC coupling the input signal and the output signal, respectively. Further, capacitor 24 is utilized for AC filtering.

In summary, the audio amplifier of FIG. 1 amplifies the signal appearing at terminal 20 by a predetermined value and provides this amplified signal at terminal 28.

Figure 2:
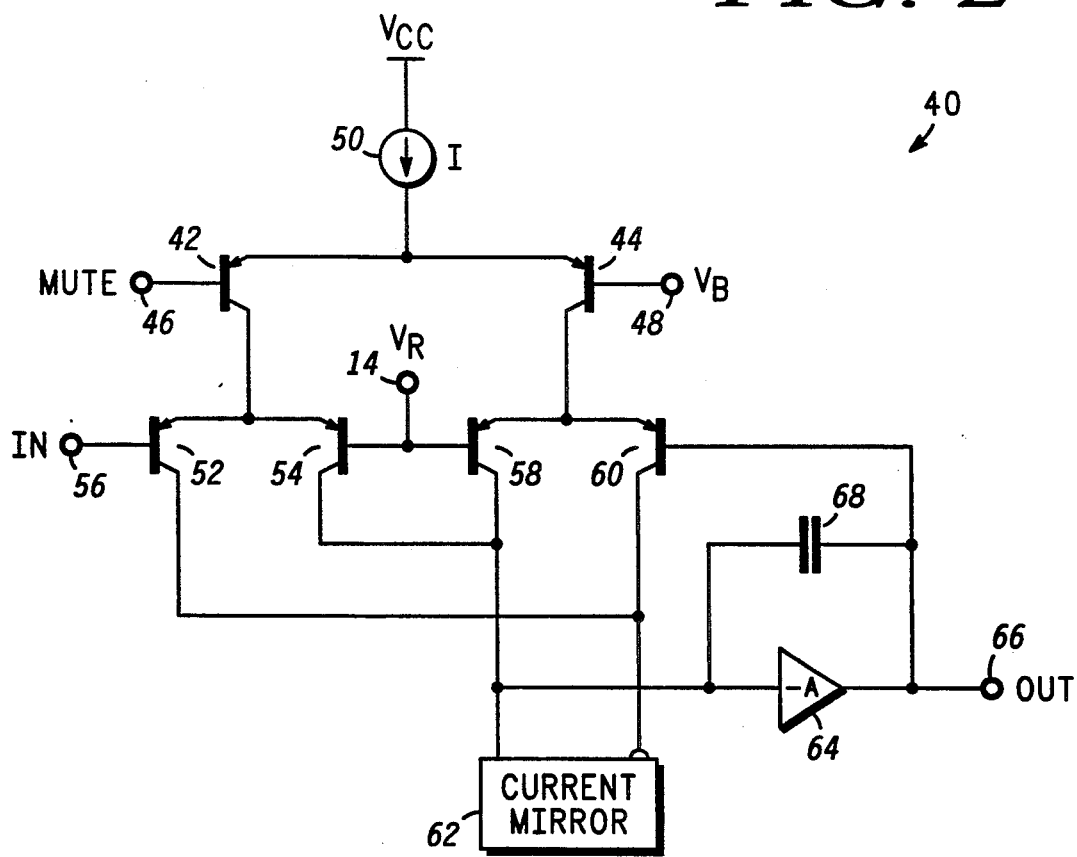
FIG. 2 is a detailed schematic/block diagram illustrating a mute circuit in accordance with the present invention.

Referring to FIG. 2, a detailed schematic/block diagram illustrating mute circuit 40 is shown comprising emitter coupled transistor pair 42 and 44 whereby the base of transistor 42 is coupled to terminal 46 at which signal MUTE is applied. The base of transistor 44 is coupled to terminal 48 at which a bias voltage $V_B$ is applied.

The emitters of transistors 42 and 44 are coupled to a first terminal of current source 50 while the second terminal of current source 50 is coupled to receive operating potential $V_{CC}$.

The collector of transistor 42 is coupled to the emitters of transistors 52 and 54 whereby transistors 52 and 54 form an emitter coupled transistor pair.

The base of transistor 52 is coupled to terminal 56 at which an input signal is applied. The bases of transistors 54 and 58 are coupled to terminal 14.

The collector of transistor 44 is coupled to the emitters of transistors 58 and 60 whereby transistors 52 and 54 form an emitter coupled transistor pair.

The collectors of transistors 52 and 60 are coupled to an input of current mirror 62. The collectors of transistors 54 and 58 are coupled to an output of current mirror 62 and to an input of inverting stage 64.

The base of transistor 60 is coupled to an output of inverting stage 64 and to terminal 66 at which an output signal of mute circuit 40 is provided.

Compensation capacitor 68 is coupled between the input and output of inverting stage 64.

Briefly, in a first mode of operation, a first op amp circuit of mute circuit 40 is activated wherein the first op amp circuit is comprised of a transistor pair which includes transistors 52 and 54, current source 50, current mirror 62 and inverting stage 64. In particular, the inverting input of the first op amp circuit appears at terminal 56, while the non-inverting input of the first op amp circuit appears at terminal 14. Further, the output of the first op amp circuit is provided at terminal 66.

However, in a second mode of operation, a second op amp circuit of mute circuit 40 is activated by switching from the first transistor pair to a second transistor pair comprised of transistors 58 and 60. As a result, the second op amp circuit activated includes transistors 58 and 60, current source 50, current mirror 62 and inverting stage 64. In particular, the inverting input of the second op amp circuit appears at the base of transistor 60, while the non-inverting input of the op amp appears at terminal 14. Further, the output of the second op amp circuit is provided at terminal 66.

The switching circuit that alternately renders transistor pair 52 and 54 and transistor pair 58 and 60 active is comprised of emitter coupled transistor pair which includes transistors 42 and 44. That is, in a normal mode of operation, the voltage applied to the base of transistor 42 is less than the voltage applied to the base of transistor 44 and all of current I flows through transistor 42 and to transistors 52 and 54. Hence, the first op amp circuit is activated.

However, in a mute mode of operation, the voltage applied to the base of transistor 42 is greater than the voltage applied to the base of transistor 44 and all of current I flows through transistor 44 and to transistors 58 and 60. Hence, the second op amp circuit is activated.

In particular, when the voltage level of signal MUTE is less than the voltage level applied at terminal 48, mute circuit 40 is operating in a first mode, a normal mode. In the first mode of operation, substantially all of current I supplied from current source 50 flows through transistor 42. Thus, transistor pair 52 and 54 are active while transistor pair 58 and 60 are rendered non-active.

In a steady state condition and assuming that mute circuit 40 is coupled in an inverting mode wherein terminal 66 is coupled back to terminal 56, substantially one-half the current of current source 50 (I/2) flows through transistor 52, while the other half of current I flows through transistor 54. This creates equal currents flowing into the input and output of current mirror 62. Therefore, substantially zero current flows through terminal 66.

However, if the voltage applied to the base of transistor 52 increases with respect to the voltage applied to the base of transistor 54, the current flowing through transistor 52 decreases, while the current flowing through transistor 54 increases thereby creating a greater current at the output of current mirror 62 than at the input of current mirror 62. As a result, an excess current exists at the output of current mirror 62.

This excess current is supplied to the input of inverting stage 64 thereby increasing the voltage at the input inverting stage 64. Further, the voltage provided at terminal 66 decreases since inverting stage 64 has a negative predetermined gain ($-A$).

It is understood that in a feedback configuration as aforementioned, the result is that the voltage applied to the base of transistor 52 is decreased to allow the currents through transistors 52 and 54 to be made substantially equal.

Likewise, it is understood that a similar operation exists when the voltage applied to the base of transistor 52 decreases with respect to the voltage applied to the base of transistor 54. In this case, the voltage provided at terminal 66 increases to provide an increased voltage at the base of transistor 52 to allow the currents through transistors 52 and 54 to be made substantially equal.

On the other hand, when the voltage appearing on signal MUTE is greater than the voltage applied to terminal 48, mute circuit 40 is operating in a second mode, a mute mode. In the second mode of operation, substantially all of current I flows through transistor 44. Thus, transistor pair 58 and 60 are active while transistor pair 52 and 54 are rendered non-active. As a result, the input signal applied to terminal 56 is not able to pass to output terminal 66.

It is important to realize that in the second mode of operation, transistors 58 and 60, along with current mirror 62, amplifier 64 and current source 50, comprise the second op amp circuit having its non-inverting input coupled to terminal 14 and its inverting input coupled to terminal 66. As a result, the second op amp circuit is configured as a unity gain amplifier. Thus, the voltage appearing at terminal 66 is regulated within an offset voltage of the voltage appearing at terminal 14. This essentially allows a smooth transistion from transistor pair 52 and 54 to transistor pair 58 and 60 thereby abating any voltage jumps occurring at the output of inverting stage 64. Thus, DC shifts at the output of mute circuit 40 is minimized thereby minimizing pop to a speaker (not shown) which may be coupled to terminal 66.

Since the second op amp circuit is coupled in a unity gain feedback mode, the output impedance of mute circuit 40 when the second op amp circuit is active is substantially equal to the open loop output impedance of inverting stage 64 divided by the total gain of the second op amp circuit which would be equal to the gain through transistors 58 and 60 plus the gain of inverting stage 64.

The total gain of the second op amp circuit is typically a very large number, for example, 200,000. Further, a typical output impedance for inverting stage 64 may be 50 ohms. As a result, the output impedance of mute circuit 40 operating in the mute mode, is very small, for example, less than a milliohm. This low output impedance for mute circuit 40 operating in the mute mode will provide excellent attenuation of an audio input signal when mute circuit 40 is configured as an audio amplifier, as will be described in detail hereinafter.

Referring to FIG. 3, a detailed schematic diagram illustrating mute circuit 40 operating with transistor pair 52 and 54 active and configured in an audio amplifier application is shown. It is understood that components shown in FIG. 3 which are identical to components shown in FIGS. 1 and 2 are identified by the same reference numbers.

In operation, since transistor pair 52 and 54 are active, mute circuit 40 is operating in the aforedescribed normal mode. In the normal mode, the first op amp circuit, which is denoted by reference number 80, is active and the operation of the circuit of FIG. 3 is identical to the aforedescribed operation of the basic audio amplifier shown in FIG. 1.

On the other hand, referring to FIG. 4, a detailed schematic diagram illustrating mute circuit 40 operating with transistor pair 58 and 60 active and configured in an audio amplifier application is shown. It is understood that components shown in FIG. 4 which are the same as components shown in FIGS. 1 and 2 are identified by the same reference numbers.

In operation, since transistor pair 58 and 60 are active, mute circuit 40 is operating in the aforedescribed mute mode. In the mute mode, the second op amp circuit, which is denoted by reference number 82, is active wherein the inverting input of op amp circuit 82 is coupled to its output to form a unity gain amplifier.

The voltage appearing at terminal 28 is maintained within an offset voltage of reference voltage $V_R$. This minimizes any DC shifts occurring at terminal 28, as aforedescribed.

In addition, the transfer function ($V_{OUT}/V_{IN}$) for the circuit of FIG. 4 can be expressed as shown in EQN. 1.

$$V_{OUT}/V_{IN} = Z_{OUT}/(Z_{OUT} + R_{16} + R_{22}) \quad (1)$$

where $Z_{OUT}$ is the output impedance of op amp circuit 82;
$R_{16}$ is the resistance of resistor 16; and
$R_{22}$ is the resistance of resistor 22.

The output impedance ($Z_{OUT}$) for unity gain op amp circuit 82 has already been shown to be less than a milliohm. Further, let $R_{16} = R_{22} = 10K$ ohms. These values yield an attenuation of over 160 dB. Thus, mute circuit 40, when operating in the mute mode, provides excellent attenuation of audio input signal $V_{IN}$.

By now it should be apparent from the foregoing discussion that a novel mute circuit for an audio amplifier has been provided. The mute circuit alternately switches from a normal mode of operation to a mute mode of operation.

In the normal mode of operation, the mute circuit utilizes a first op amp circuit to amplify an input signal by a predetermined factor.

In the mute mode of operation, the mute circuit utilizes a second op amp circuit which is configured as an unity gain amplifier. In the mute mode, DC shifts occurring at the output of th second op amp circuit are minimized.

Further, the second op amp circuit has a low output impedance thereby providing excellent attenuation of an audio input signal when the mute circuit is utilized in an audio amplifier application.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

I claim:

1. An audio amplifier having inverting and non-inverting inputs and an output, the non-inverting input being coupled to receive a reference voltage, the inverting input being coupled to receive an audio input signal, the output being coupled through a feedback resistor to the inverting input, the output also providing an output signal at an output terminal of the audio amplifier, the audio amplifier including a mute circuit, the mute circuit comprising:

a first transistor pair including first and second transistors, each transistor of said first transistor pair having a collector, a base and an emitter, said base of said first transistor being coupled to receive the audio input signal, said emitter of said first transistor being coupled to said emitter of said second transistor, said base of said second transistor being coupled to receive the reference voltage;

a second transistor pair including third and fourth transistors, each transistor of said second transistor pair having a collector, a base and an emitter, said base of said third transistor being coupled to receive the reference voltage, said emitter of said third transistor being coupled to said emitter of said fourth transistor, said collector of said third transistor being coupled to said collector of said second transistor, and said collector of said fourth transistor being coupled to said collector of said first transistor;

switching means coupled to said emitters of said first, second, third and fourth transistors for alternately providing current to said first and second transistor pairs in response to a control signal;

a current mirror having an input and an output, said input of said current mirror being coupled to said collectors of said first and fourth transistors, and said output of said current mirror being coupled to said collectors of said second and third transistors; and an inverting stage having an input and an output, said input of said inverting stage being coupled to said output of said current mirror, said output of said inverting stage being coupled to said base of said fourth transistor, said output of said inverting stage being coupled to the output terminal of the audio amplifier.

2. The circuit according to claim 1 wherein said switching means includes;

a third transistor pair including fifth and sixth transistors, each transistor of said third transistor pair having a collector, a base and an emitter, said base of said fifth transistor being coupled to receive said control signal, said collector of said fifth transistor being coupled to said emitters of said first and second transistors, said emitter of said fifth transistor being coupled to said emitter of said sixth transistor, said base of said sixth transistor being coupled to receive a bias voltage, and said collector of said sixth transistor being coupled to said emitters of said third and fourth transistors; and a current source having first and second terminals, said first terminal of said current source being coupled to a first supply voltage terminal, and said second terminal of said current source being coupled to said emitters of said fifth and sixth transistors.

3. The circuit according to claim 2 further including a capacitor coupled between said input of said inverting stage and said output of said inverting stage.

4. A circuit responsive to a control signal, comprising:

a first transistor pair including first and second transistors, each transistor of said first transistor pair having a collector, a base and an emitter, said base of said first transistor being coupled to receive an input signal, said emitter of said first transistor being coupled to emitter of said second transistor, said base of said second transistor being coupled to receive a reference voltage;

a second transistor pair including third and fourth transistors, each transistor of said second transistor pair having a collector, a base and an emitter, said base of said third transistor being coupled to receive said reference voltage, said emitter of said third transistor being coupled to said emitter of said fourth transistor, said collector of said third transistor being coupled to said collector of said second transistor, and said collector of said fourth transistor being coupled to said collector of said first transistor;

switching means coupled to said emitters of said first, second, third and fourth transistors for alternately providing current to said first and second transistor pairs in response to the control signal;

a current mirror having an input and an output, said input of said current mirror being coupled to said collectors of said first and fourth transistors, and said output of said current mirror being coupled to said collectors of said second and third transistors; and an inverting stage having an input and an output, said input of said inverting stage being coupled to said output of said current mirror, said output of said inverting stage being coupled to said base of said fourth transistor, said output of said inverting stage providing an output signal of the circuit.

5. The circuit according to claim 4 wherein said switching means includes;

a third transistor pair including fifth and sixth transistors, each transistor of said third transistor pair having a collector, a base and an emitter, said base of said fifth transistor being coupled to receive the control signal, said collector of said fifth transistor being coupled to said emitters of said first and second transistors, said emitter of said fifth transistor being coupled to said emitter of said sixth transistor, said base of said sixth transistor being coupled to receive a bias voltage, and said collector of said sixth transistor being coupled to said emitters of said third and fourth transistors; and a current source having first and second terminals, said first terminal of said current source being coupled to a first supply voltage terminal, and said second terminal of said current source being coupled to said emitters of said fifth and sixth transistors.

6. The circuit according to claim 5 further including a capacitor coupled between said input of said inverting stage and said output of said inverting stage.

* * * * *